United States Patent
Rubin

(10) Patent No.: US 10,593,681 B1
(45) Date of Patent: Mar. 17, 2020

(54) THREE-DIMENSIONAL MONOLITHIC VERTICAL TRANSISTOR MEMORY CELL WITH UNIFIED INTER-TIER CROSS-COUPLE

(71) Applicant: INTERNATIONAL BUSINESS MACHINES CORPORATION, Armonk, NY (US)

(72) Inventor: Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/106,176

(22) Filed: Aug. 21, 2018

(51) Int. Cl.
| | |
|---|---|
| G11C 11/00 | (2006.01) |
| H01L 27/11 | (2006.01) |
| H01L 27/02 | (2006.01) |
| H01L 21/8234 | (2006.01) |
| H01L 27/06 | (2006.01) |

(52) U.S. Cl.
CPC .. H01L 27/1104 (2013.01); H01L 21/823425 (2013.01); H01L 21/823487 (2013.01); H01L 27/0211 (2013.01); H01L 27/0688 (2013.01)

(58) Field of Classification Search
CPC .................................................. G11C 11/417
USPC ....................................................... 365/154
See application file for complete search history.

(56) References Cited

U.S. PATENT DOCUMENTS

| | | |
|---|---|---|
| 6,137,129 A | 10/2000 | Bertin et al. |
| 6,759,699 B1 | 7/2004 | Chi |
| 7,098,478 B2 | 8/2006 | Takaura et al. |
| 7,138,685 B2 | 11/2006 | Hsu et al. |
| 7,678,658 B2 | 3/2010 | Yang et al. |
| 8,409,948 B2 | 4/2013 | Fischer et al. |
| 8,853,700 B2 | 10/2014 | Sardesai et al. |
| 9,362,292 B1 | 6/2016 | Liaw |
| 9,685,436 B2 | 6/2017 | Morrow et al. |
| 2015/0318288 A1 | 11/2015 | Lim et al. |
| 2016/0197069 A1 | 7/2016 | Morrow et al. |
| 2017/0110180 A1* | 4/2017 | Guo ....................... G11C 11/412 |
| 2018/0122793 A1* | 5/2018 | Moroz ................ H01L 29/4238 |
| 2018/0301380 A1* | 10/2018 | Or-Bach ............. H01L 25/0655 |

OTHER PUBLICATIONS

A. Veloso et al Junctionless Gate-All-Around Lateral and Vertical Nanowire FETs with Simplified Processing for Advanced Logic and Analog/RF Applications and Scaled SRAM Cells 2016 Symposium on VLSI Technology Digest of Technical Papers Sep. 22, 2016 pp. 1-2 IEEE.

* cited by examiner

Primary Examiner — Hoai V Ho
(74) Attorney, Agent, or Firm — Tutunjian & Bitetto, P.C.; Alvin Borromeo

(57) ABSTRACT

A semiconductor device includes a bottom tier including a plurality of first vertical transistors and at least one contact disposed on a first inverter gate. The device further includes a top tier including a plurality of second vertical transistors and a second inverter gate, and a monolithic inter-tier via (MIV) that lands on the at least one contact via the second inverter gate to create a three-dimensional monolithic vertical transistor memory cell with unified inter-tier cross-couple.

18 Claims, 10 Drawing Sheets

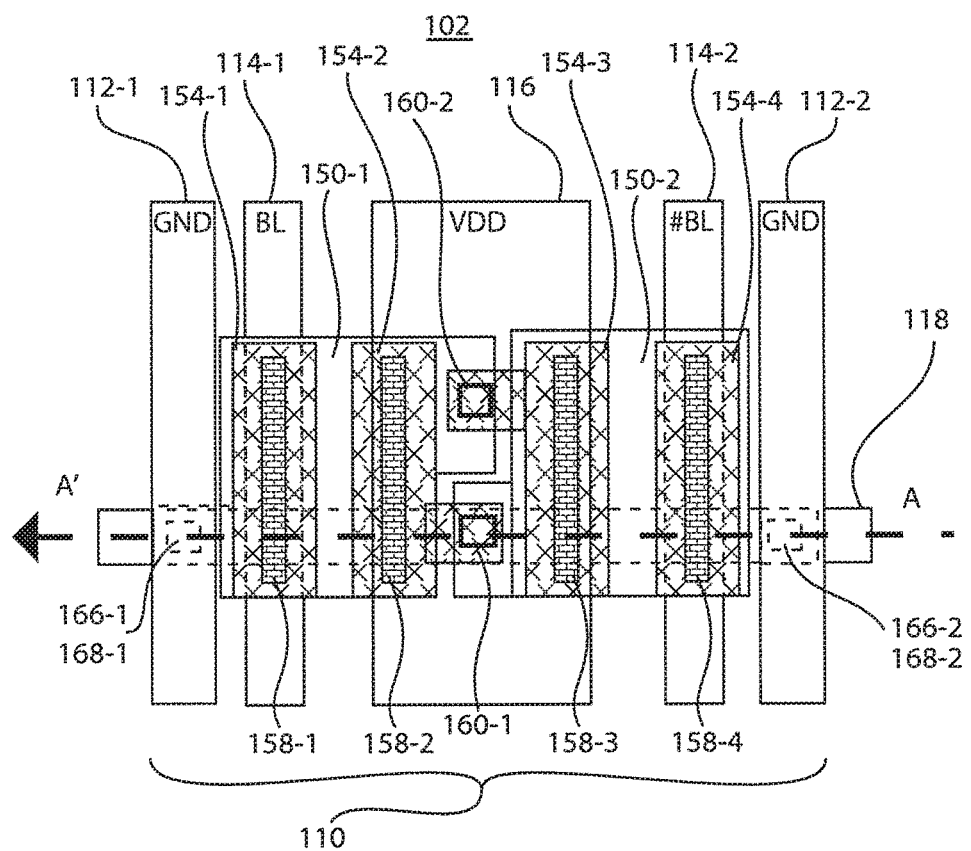
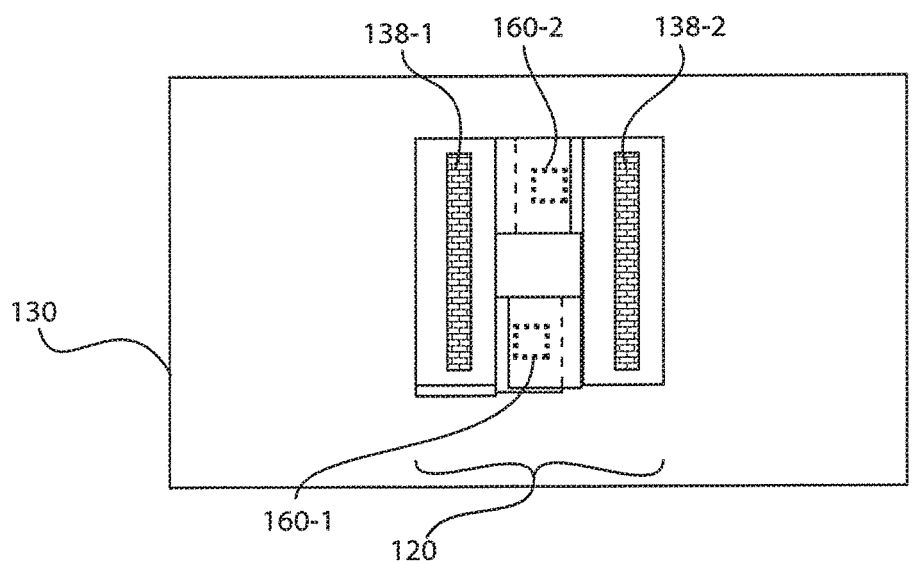
FIG. 1

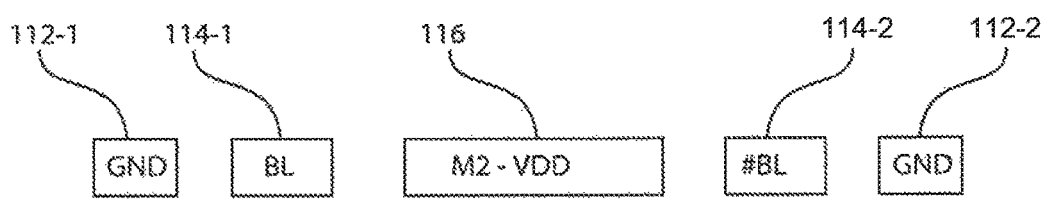
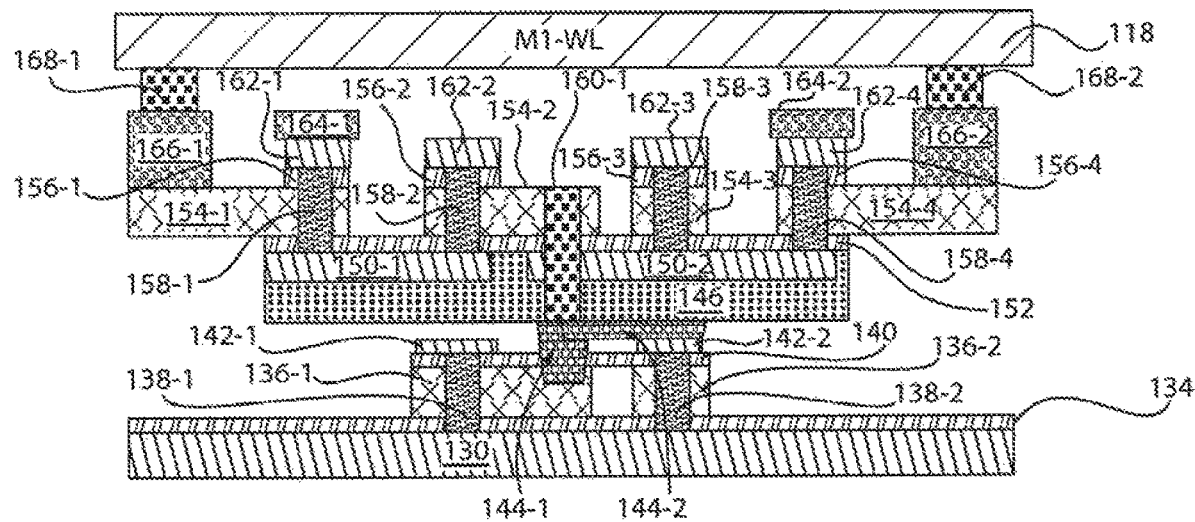
FIG. 2

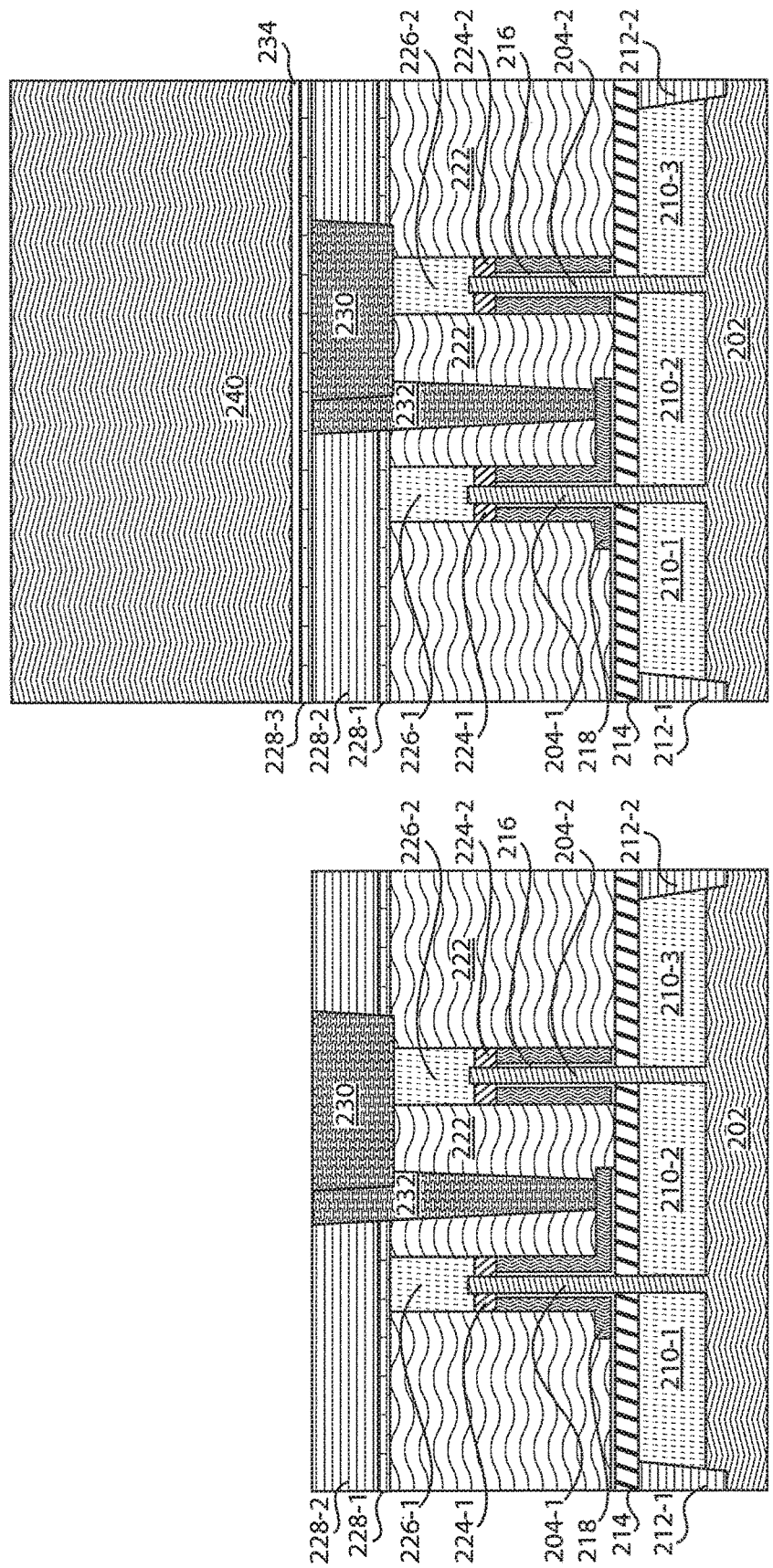

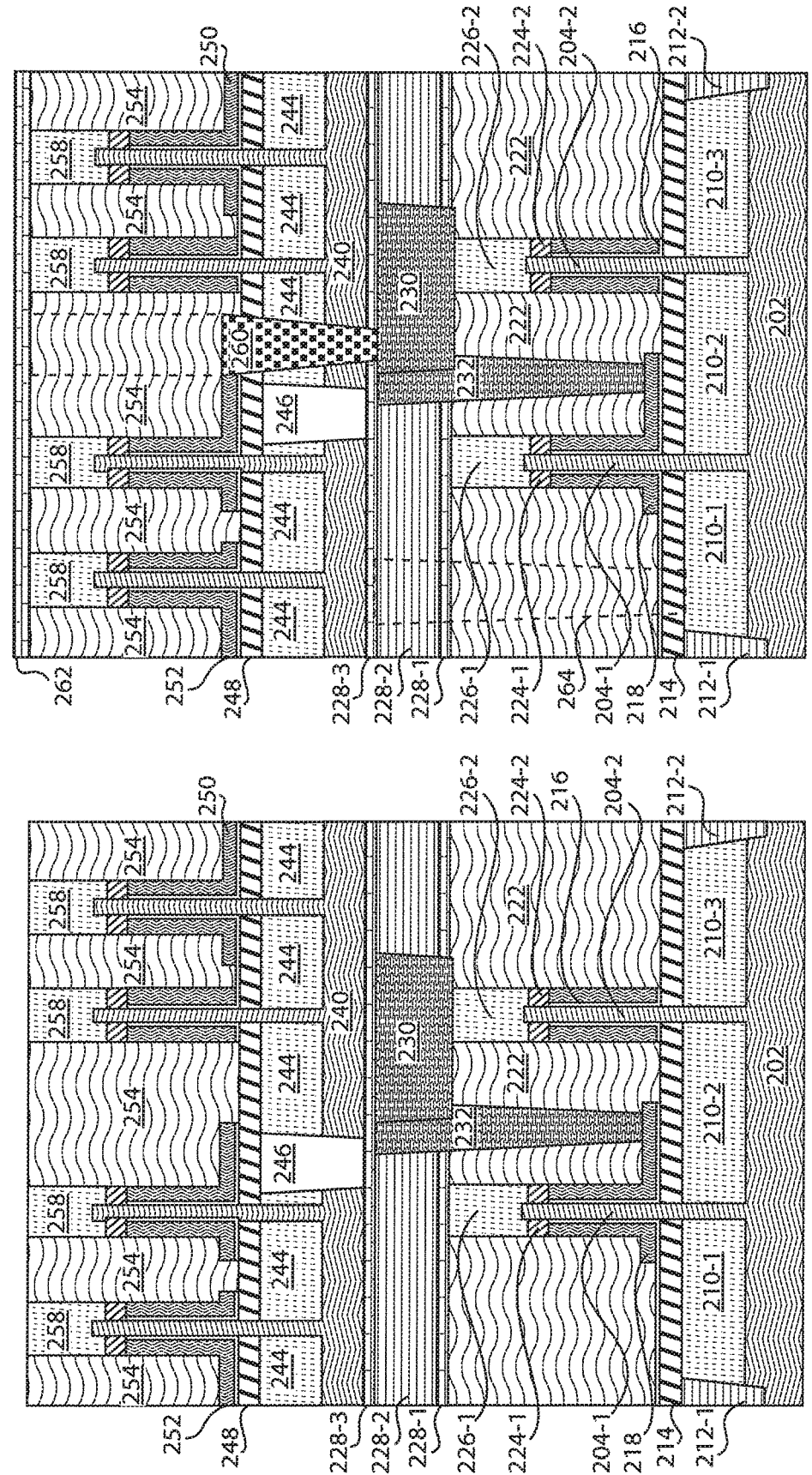

US 10,593,681 B1

THREE-DIMENSIONAL MONOLITHIC VERTICAL TRANSISTOR MEMORY CELL WITH UNIFIED INTER-TIER CROSS-COUPLE

BACKGROUND

Technical Field

The present invention generally relates to semiconductor devices, and more particularly to semiconductor devices including a three-dimensional (3D) monolithic vertical transistor memory cell with unified inter-tier cross-couple.

Description of the Related Art

Vertical transistors, such as vertical field-effect transistors (FETs), have been devised as a way to reduce contact poly pitch (CPP) to decrease unit cell size and increase efficiency by orienting current flow vertically. Vertical transistors can provide for better electrostatic control of channels (e.g., gate-all-around channels). Further, since the ohmic contacts and the channels are aligned vertically, contact density per unit of surface area of a vertical transistor is higher than in a lateral transistor.

SUMMARY

In accordance with an embodiment of the present invention, a method for fabricating a semiconductor device is provided. The method includes forming a bottom tier including a plurality of first vertical transistors and at least one contact formed on a first inverter gate. The method further includes forming a top tier including a plurality of second vertical transistors and a second inverter gate. The method further includes connecting the bottom tier to the top tier to create a three-dimensional monolithic vertical transistor memory cell with unified inter-tier cross-couple by forming a monolithic inter-tier via (MIV) that lands on the at least one contact via the second inverter gate.

In accordance with another embodiment of the present invention, a method for fabricating a semiconductor device is provided. The method includes forming a bottom tier including a plurality of first vertical transport field-effect transistors (VTFETs) associated with a first conductivity type and at least one contact formed on a first inverter gate. The method further includes forming a top tier including a plurality of second VTFETs associated with a second conductivity type and a second inverter gate. The method further includes connecting the bottom tier to the top tier to create a three-dimensional monolithic vertical transistor memory cell with unified inter-tier cross-couple by forming a monolithic inter-tier via (MIV) that lands on the at least one contact via the second inverter gate.

In accordance with yet another embodiment of the present invention, a semiconductor device is provided. The device includes a bottom tier including a plurality of first vertical transistors and at least one contact disposed on a first inverter gate. The device further includes a top tier including a plurality of second vertical transistors and a second inverter gate, and a monolithic inter-tier via (MIV) that lands on the at least one contact via the second inverter gate to create a three-dimensional monolithic vertical transistor memory cell with unified inter-tier cross-couple.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a top-down view showing a semiconductor device a including three-dimensional (3D) monolithic vertical transistor memory cell with unified inter-tier cross-couple, in accordance with an embodiment of the present invention;

FIG. 2 is a cross-sectional view of the device of FIG. 1, in accordance with an embodiment of the present invention;

FIG. 12 is a cross-sectional view showing the formation of a gate contact and a top source/drain contact during the fabrication of the bottom portion of the semiconductor device, in accordance with an embodiment of the present invention;

FIG. 13 is a cross-sectional view showing the transfer of a layer of semiconductor material on top of the bottom portion of the semiconductor device using wafer bonding during the fabrication of the semiconductor device, in accordance with an embodiment of the present invention;

FIG. 14 is a cross-sectional view showing processing performed during the fabrication of a top portion of the semiconductor device, in accordance with an embodiment of the present invention;

FIG. 15 is a cross-sectional view showing the formation of contacts including a monolithic inter-tier via (MIV) during the fabrication of the semiconductor device, in accordance with an embodiment of the present invention.

DETAILED DESCRIPTION

Figure 3:
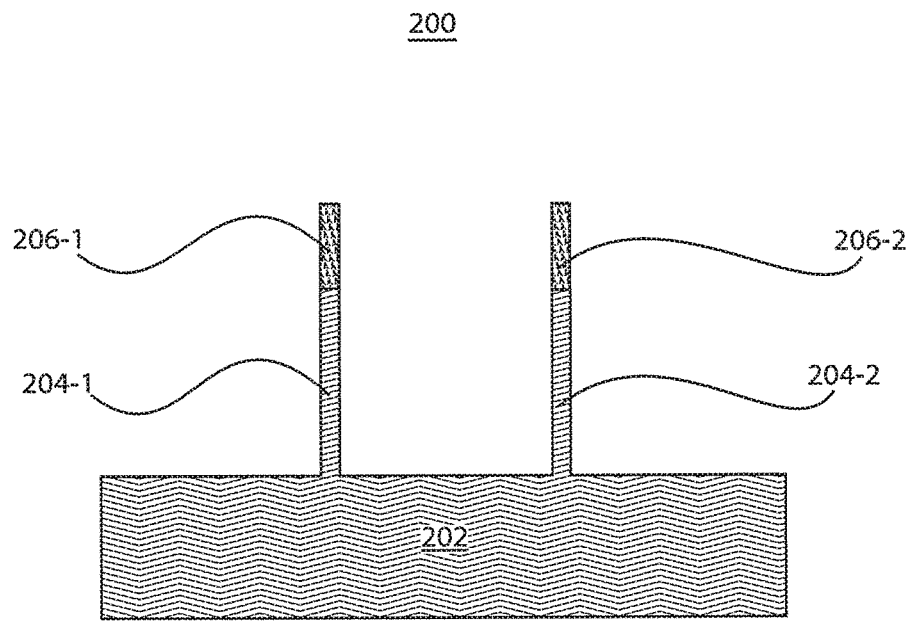
FIG. 3 is a cross-sectional view showing the formation of fins and hard masks disposed on the fins during the fabrication of a bottom portion of the semiconductor device, in accordance with an embodiment of the present invention.

Three-dimensional (3D) monolithic integration generally allows for the vertical stacking of devices on a single die to reduce die area and increase die performance. More specifically, 3D monolithic integration methods generally allow for components of the devices and their connections to be built within multiple tiers on a single die.

Embodiments of the present invention provide for a vertical transistor memory cell with unified inter-tier cross-coupling, that may be used for 3D monolithic integration. The vertical transistor memory cell formed in accordance with the embodiments described herein includes a top tier and a bottom tier each having respective vertical transistors. The top tier can include p-type vertical transistors (e.g., pFETs) and the bottom tier includes n-type vertical transistors (e.g., nFETs).

The top and bottom tiers are connected to create a 3D monolithic vertical transistor memory cell with unified inter-tier cross-couple by forming monolithic inter-tier via (MIVs). As will be further described herein, the MIVs can penetrate and contact the top-level gate, the top-level "bottom drain," the bottom-level "top drain," an bottom-level gate to form a compact unified cross-couple between inverters of the memory cell. Additionally, the gate and source/drain contacts can occur adjacent to the fins within the fin length, as opposed to the top and bottom regions of a standard cell.

In accordance with aspects of the present invention, the integration of the stacked vertical transistor devices within the 3D monolithic scheme provides a variety of benefits, such as with respect to logic. For example, one or more of the following benefits can be realized: (1) tighter packing of circuits so that back-end-of-the-line (BEOL) wire length is reduced for power and performance benefit; and (2) higher drive strength in a given areal footprint.

Exemplary applications/uses to which the present invention can be applied include, but are not limited to, fabricating memory devices. For example, embodiments of the present invention can be applied to the fabrication of a static random-access memory (SRAM) device formed from SRAM cells. As is known in the art, an SRAM cell is composed of transistors, which can include metal-oxide-semiconductor FETs (MOSFETs). For example, in a six transistor SRAM cell (i.e., a 6T SRAM cell), each bit is stored on four transistors that form cross-coupled inverters, and the other two transistors are access transistors that control access to a storage cell during read and write operations. In the 6T SRAM cell embodiment discussed herein, the top tier can include four p-type vertical transistors, and the bottom tier can include two n-type vertical transistors. For example, the top tier could include two pass-gates. However, such embodiments are not limiting. For example, in an alternative embodiment, the top tier can include n-type vertical transistors and the bottom tier can include n-type vertical transistors.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIG. 1 depicts a top-down view of a top tier 102 of a semiconductor device 100 including a 3D monolithic vertical transistor memory cell with unified inter-tier cross-couple, and a top-down view of a bottom tier 104 of the device 100.

In this illustrative embodiment, the device 100 is a six-transistor (6T) memory device. For example, the top tier 102 is shown including four vertical transistors 110 formed on a bottom source/drain (S/D) region 150-1 and a bottom S/D region 150-2, and the bottom tier 104 is shown including two vertical transistors formed on a bottom S/D region 130. The vertical transistors 110 and 120 can illustrative include vertical transport field-effect transistors (VTFETs). In one embodiment, the vertical transistors 110 are associated with a first conductivity type and the vertical transistors 120 are associated with a second conductivity type. For example, the first conductivity type could be p-type and the second conductivity type could be n-type. However, in an alternate embodiment, the first conductivity type could be n-type and the second conductivity type could be p-type. In one embodiment, the device 100 includes an SRAM memory cell. For example, as shown in FIG. 1, the device 100 includes a first ground line (GND) 112-1, a second GND 112-2, a bit line (BL) 114-1, an inverse BL (# BL) 114-2, a supply voltage line (VDD) 116, and a word line (WL) 118. One or more of the lines 112 through 118 can be shared between adjacent cells.

The vertical transistors 110 include gates 154-1 through 154-4 and channels 158-1 through 158-4. A via 160-1, referred to herein as a monolithic inter-tier via (MIV) 160-1, is formed through a portion of the gate 154-2 extending toward the center of the top tier 102. An MIV 160-2 is formed through a portion of the gate 154-3 extending toward the center of the top tier 102. A gate contact 166-1 and via 168-1 are formed on a portion of the gate 154-1 extending to GND 112-1, and a gate contact 166-2 and via 168-2 are formed on a portion of the gate 154-4 extending to GND 112-2. The MIVs 160-1 and 160-2 are formed to connect the tiers 102 and 104. The vertical transistors 120 include channels 138-1 and 138-2. The MIVs 160-1 and 160-2 are formed to at least one contact (not shown in FIG. 1) of the bottom tier 104. Further details regarding the components of the top tier 102 and the bottom tier 104 will now be described with reference to FIG. 2.

With reference to FIG. 2, a cross-sectional view of the device 100 taken through the cross-section "A-A'" is depicted.

In the bottom tier 102, a bottom spacer 134 is disposed on a bottom S/D region 130. Gates 136-1 and 136-2 are disposed on the bottom spacer 134. The gate 136-1 is an inverter gate that, as will be described in further detail below, will be cross-coupled with an inverter gate in the top tier 104. A top spacer 140 is disposed on the gates 136-1 and 136-2. Gates 136-1 and 136-2 include a gate conductive material such as e.g., polycrystalline silicon, a metal (e.g., work function metal), or a combination of these materials.

As further shown, channel 138-1 penetrates through the top spacer 140 and gate 136-1 and lands on the bottom S/D region 130, and channel 138-2 penetrates through the top spacer 140 and gate 135-2 and lands on the bottom S/D region 130. A top S/D region 142-1 is formed on the top spacer 140 and the channel 138-1, and a top S/D region 142-2 is formed on the top spacer 140 and the channel 138-2. The bottom tier 102 further includes a gate contact 144-1 contacting the gate 136-1 (e.g., a plug in ohmic contact with the gate 136-1) and an S/D contact 144-2 formed on the top S/D region 142-2 (e.g., a local interconnect line).

A bonding layer 146 is formed that bonds the bottom tier 102 and the top tier 104. For example, the bonding layer 146 can formed by depositing bonding film on a wafer formed on the bottom tier, depositing bonding film on a wafer of the top tier, and bonding the wafers together (e.g., using oxide to oxide wafer bonding). Further processing can be performed to leave a semiconductor layer (e.g., Si) on top of the bonding layer 146 for forming the top tier 104.

In the top tier 104, bottom S/D regions 150-1 and 150-2 are formed, and a bottom spacer 152 is disposed on the bottom S/D regions 150-1 and 150-2. Gates 154-1 through 154-4 are formed on the bottom spacer 152. Gates 154-1 and 154-4 are pass through gates, and gate 154-2 is a portion of an inverter made between the top and bottom tiers. Top spacers 156-1 through 156-4 are formed on respective ones of gates 154-1 through 154-4. Gates 154-1 through 154-4 can be formed from gate conductive material such as e.g., polycrystalline silicon, a metal (e.g., work function metals and/or non-work function metals), or a combination of these materials.

As further shown, channel 158-1 penetrates through the top spacer 156-1 and gate 154-1 and lands on the bottom S/D region 150-1, channel 158-2 penetrates through the top spacer 156-2 and gate 154-2 and lands on the bottom S/D region 150-1, channel 158-3 penetrates through the top spacer 156-3 and gate 154-3 and lands on the bottom S/D region 150-2, and channel 158-4 penetrates through the top spacer 156-4 and gate 154-4 and lands on the bottom S/D region 150-2.

As shown, MIV 160-1 lands on the S/D contact 144-2 in the bottom tier 104 via the gate 154-2 and the bottom S/D region 150-2. In this illustrative example, MIV 160-1 penetrates through the gate 154-2 and the bottom S/D region 150-2. However, MIV 160-1 can fully penetrate, partially penetrate, abut, and/or partially abut the gate 154-2 and bottom S/D region 150-2. MIV 160-1 connects (e.g., directly or indirectly connects) the gates 154-2 and 136-1 to an output of the "right" inverter including bottom S/D region 150-2 and S/D contact 144-2.

Although not shown in this cross-section, MIV 160-2 shown in FIG. 1 connects the gates 154-3 and 136-2 to an output of the "left" inverter including bottom S/D region 150-1 and another S/D contact (not shown) connected to top S/D region 142-1. Accordingly, the MIVs create a cross-coupling between inverters of the device 100.

As further shown, top S/D regions 162-1 through 162-4 are disposed on respective ones of the top spacers 156-1 through 156-4 and channels 158-1 through 158-4. A S/D contact 164-1 is formed on top S/D region 162-1 and a S/D contact 164-2 is formed on top S/D region 162-4 (e.g., local interconnect lines). Gate contact 166-1 is formed on gate 154-1 and gate contact 166-2 is formed on gate 154-4 (e.g., plugs in ohmic contact with the gates 154-1 and 154-4). Via 168-1 is disposed on gate contact 166-1 and via 168-2 is disposed on gate contact 166-2. WL 118 is disposed on vias 168-1 and 168-2.

Further details regarding the fabrication of the device 100 will now be described below with reference to FIGS. 3-16.

FIGS. 3-15 depict respective steps of a process flow for fabricating a semiconductor device 200 including a 3D monolithic vertical transistor memory cell with unified intertier cross-couple, such as the semiconductor device described above with reference to FIGS. 1 and 2.

Referring to FIG. 3, a plurality of fins including fin 204-1 and fin 204-2 are formed from a substrate 202. The substrate 202 can include any suitable substrate structure, e.g., a bulk semiconductor, a semiconductor-on-insulator (SOI) substrate, etc. In one example, the substrate 202 can include a silicon-containing material. Illustrative examples of Si-containing materials suitable for the substrate 202 can include, but are not limited to, Si, SiGe, SiGeC, SiC and multi-layers thereof. The substrate can include epitaxially grown material (e.g., epitaxially grown SiGe). Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As further shown in FIG. 3, a hard mask 206-1 is formed on fin 204-1, and a hard mask 206-2 is formed on fin 204-2. The hard masks 206-1 and 206-2 can be formed using any suitable processes. For example, a pattern can be transferred into the substrate 202 using a mask including the hard masks 206-1 and 206-2. The hard masks 206-1 and 206-2 can include one or more layers of dielectric material. The dielectric material can include any suitable material in accordance with the embodiments described herein. For example, hard masks 206-1 and 206-2 can include one or more oxides, one or more nitrides and/or combinations thereof.

Figure 4:
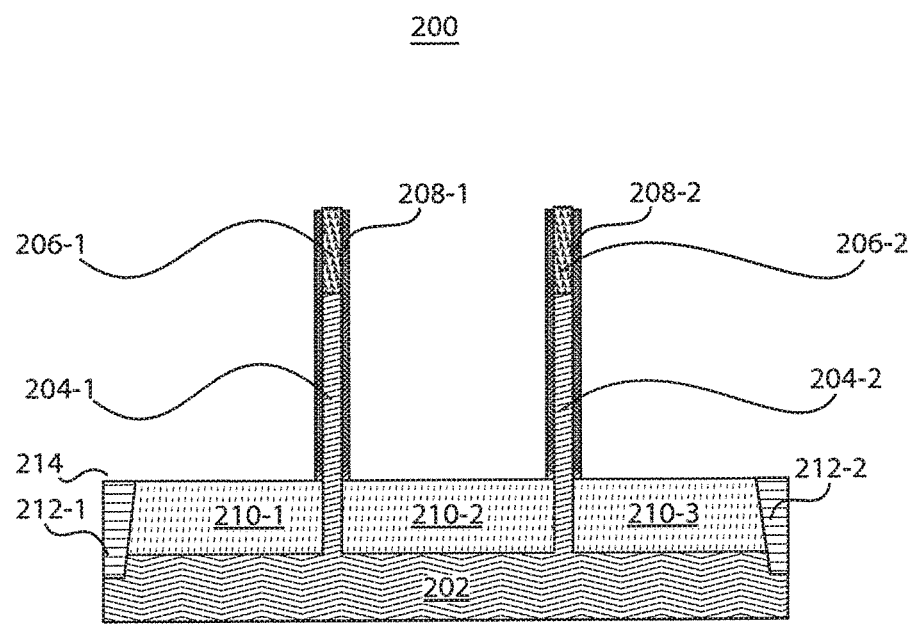
FIG. 4 is a cross-sectional view showing the formation of a bottom source/drain region, shallow trench isolation regions and a liner during the fabrication of the bottom portion of the semiconductor device, in accordance with an embodiment of the present invention.

Referring to FIG. 4, a liner portion 208-1 is formed along the sidewalls of the fin 204-1 and the hard mask 206-1, and liner portion 208-2 is formed along the sidewalls of the fin 204-2 and the hard mask 206-2. The liner portions 208-1 and 208-2 can be formed by depositing a blanket layer of a liner material, and etching the liner (e.g., using reactive-ion etching (RIE)) to form the liner portions 208-1 and 208-2. The liner portions 208-1 and 208-2 are formed to protect the fins during the formation of a bottom source/drain (S/D) region, including portions 210-1, 210-2 and 210-3. The bottom S/D region can be formed by etching bottom S/D cavities and epitaxially growing the bottom S/D region.

Epitaxial growth refers to the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial growth process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

As further shown, shallow trench isolation (STI) regions 212-1 and 212-2 are formed adjacent within the substrate 202 and adjacent to portions of the bottom S/D region 210-1 and 210-2, respectively. The STI regions 212-2 and 212-2 can be formed using any suitable process in accordance with the embodiments described herein, and can include any suitable dielectric material in accordance with the embodiments described herein.

Figure 5:
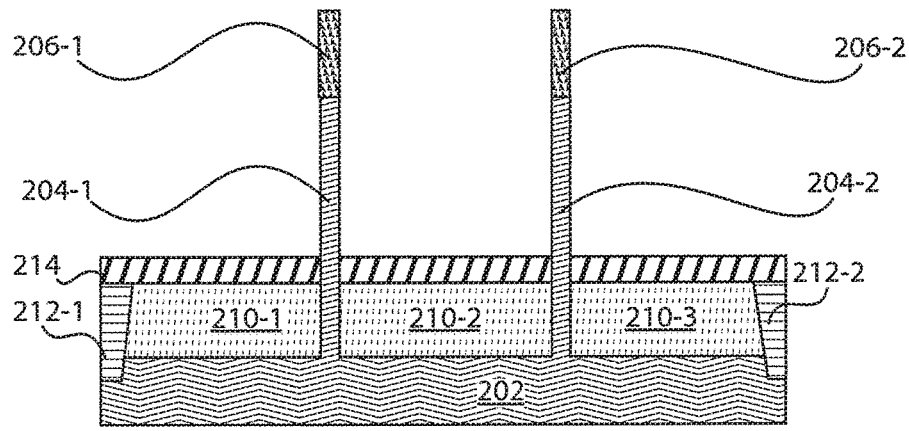
FIG. 5 is a cross-sectional view showing the formation of a bottom spacer after removal of the liner during the fabrication of the bottom portion of the semiconductor device, in accordance with an embodiment of the present invention.

Referring to FIG. 5, the liners 208-1 and 208-2 are removed, and a bottom spacer 214 is formed on the bottom S/D region and the STI regions 212-1 and 212-2. The bottom spacer 214 functions as an insulator. The bottom spacer 214 can be formed using any suitable process in accordance with the embodiments described herein, and can include any suitable dielectric material in accordance with the embodiments described herein (e.g., SiBCN, SiOCN, SiN or $SiO_2$).

Figure 6:
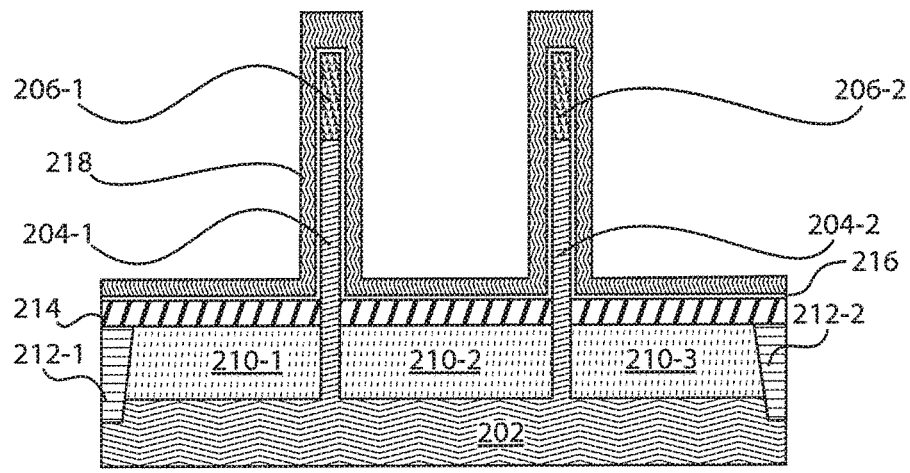
FIG. 6 is a cross-sectional view showing the formation of a gate stack during the fabrication of the bottom portion of the semiconductor device, in accordance with an embodiment of the present invention.

Referring to FIG. 6, gate structures are formed. As shown, the gate structures include dielectric layer 216 conformally deposited along surfaces of the bottom spacer 214, the fins 204-1 and 204-2, and the hard masks 206-1 and 206-2. In one embodiment, the dielectric layer 216 includes a high-k dielectric material. A high-k dielectric material is a dielectric material having a dielectric constant (k) higher than the dielectric constant of silicon dioxide ($SiO_2$) at room temperature (e.g., about 20° C.–25° C.) and atmospheric pressure (about 1 atm). Some examples of high-k dielectric materials suitable for the dielectric layer 120 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof.

The gate structures further include one or more gate layers including work function metal (WFM) layer 218 deposited along the dielectric layer 216. The WFM layer 218 can include any suitable material in accordance with the embodiments described herein. For example, the WFM layer 218 can include, e.g., titanium nitride (TiN), tantalum nitride (TaN) ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN, TaN, and combinations thereof. Although not shown, the one or more gate layers can additional include one or more additional layers of conductive materials to form the gate structures.

The gate structures including the dielectric layer 216 and the one or more gate layers including WFM layer 218 may be formed using, for example, deposition techniques including, but not limited to, CVD, PECVD, RFCVD, PVD, ALD, MLD, MBD, PLD, and/or LSMCD, sputtering, and/or plating."

Figure 7:
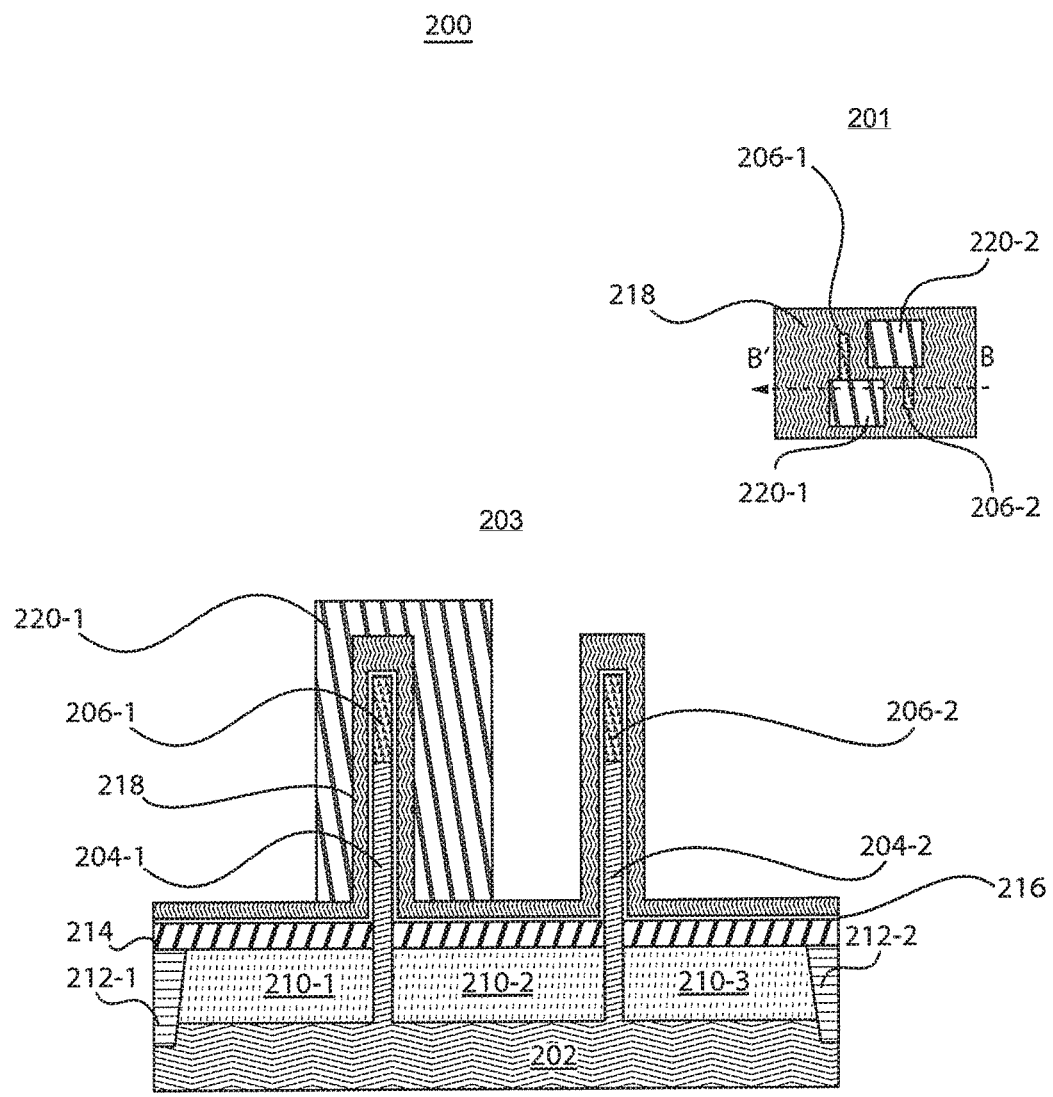
FIG. 7 is a top-down view and a cross-sectional view showing the formation of a block mask during the fabrication of the bottom portion of the semiconductor device, in accordance with an embodiment of the present invention.

Referring to FIG. 7, a top-down view 201 and a cross-sectional view 203 taken through line "B-B'" of the device 200 are provided illustrating the formation of a block mask 220-1 to protect a portion of the WFM layer 218 at the foot of the fin 204-1 and a block mask 220-2 to protect a portion of the WFM layer 218 at the foot of the fin 204-2 for the SRAM cross-couple. The block masks 220-1 and 220-2 can include photoresist block masks and/or organic planarization layer (OPL) block masks.

Figure 8:
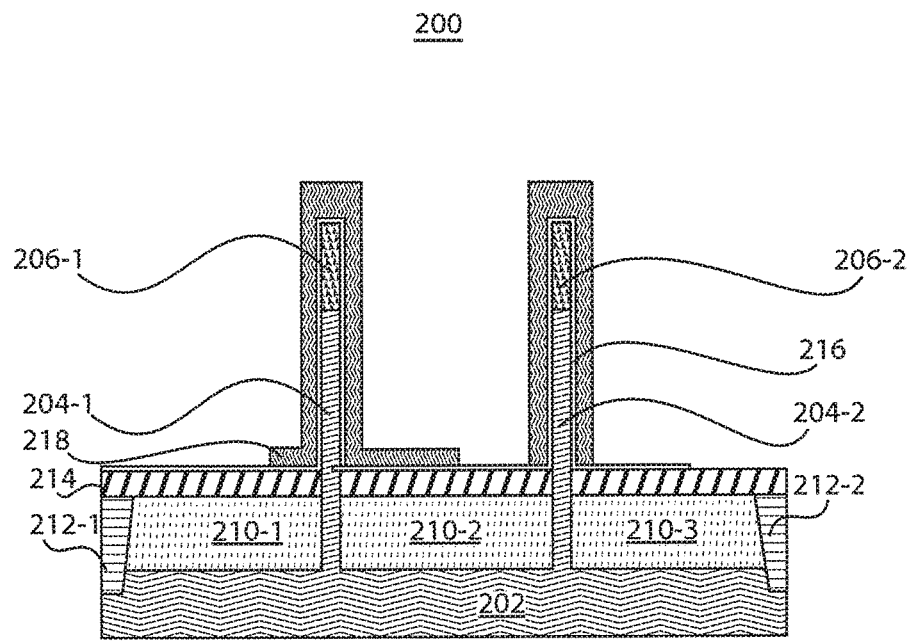
FIG. 8 is a cross-sectional view showing the removal of the block mask after etching the gate stack during the fabrication of the bottom portion of the semiconductor device, in accordance with an embodiment of the present invention.

Referring to FIG. 8, the gate material is etched to remove material not protected by the block masks 220-1 and 220-2, thereby forming gate stacks corresponding to respective ones of the fins 204-1 and 204-2. In one embodiment, etching the gate material includes performing directional RIE. Referring back to FIG. 2, the gate stack corresponding to the fin 204-1 can correspond to at least a portion of an inverter gate.

Referring back to FIG. 8, the block masks 220-1 and 220-2 are then removed/stripped. The block masks 220-1 and 220-2 can be removed/stripped using any suitable process in accordance with the embodiments described herein.

Figure 9:
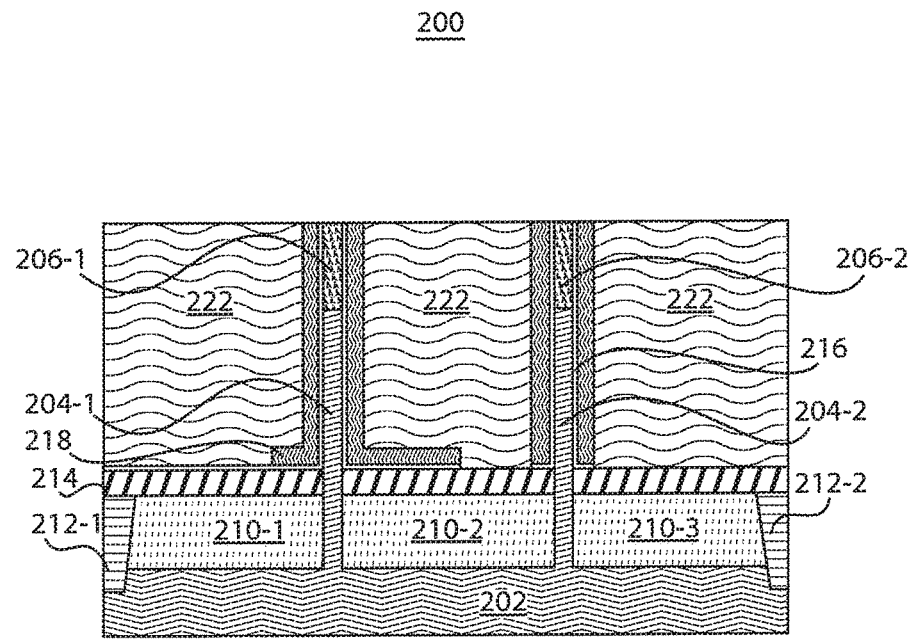
FIG. 9 is a cross-sectional view showing the formation of interlayer dielectrics (ILDs) during the fabrication of the bottom portion of the semiconductor device, in accordance with an embodiment of the present invention.

Referring to FIG. 9, dielectric material is deposited and planarized to the top of the hard masks 206-1 and 206-2 to form inter-layer dielectrics (ILDs) 222. In one embodiment, chemical-mechanical planarization (CMP) is used to planarize the dielectric material.

Figure 10:
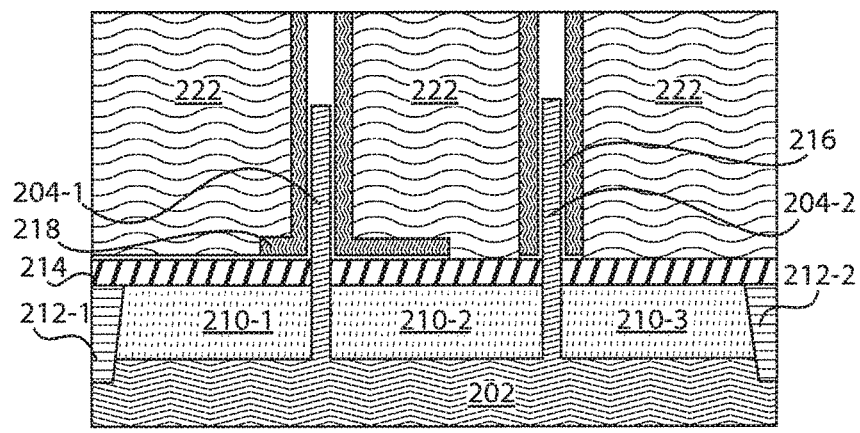
FIG. 10 is a cross-sectional view showing the selective removal of the hard masks during the fabrication of the bottom portion of the semiconductor device, in accordance with an embodiment of the present invention.

Referring to FIG. 10, the hard masks 206-1 and 206-2 are selectively removed using any suitable process in accordance with the embodiments described herein.

Figure 11:
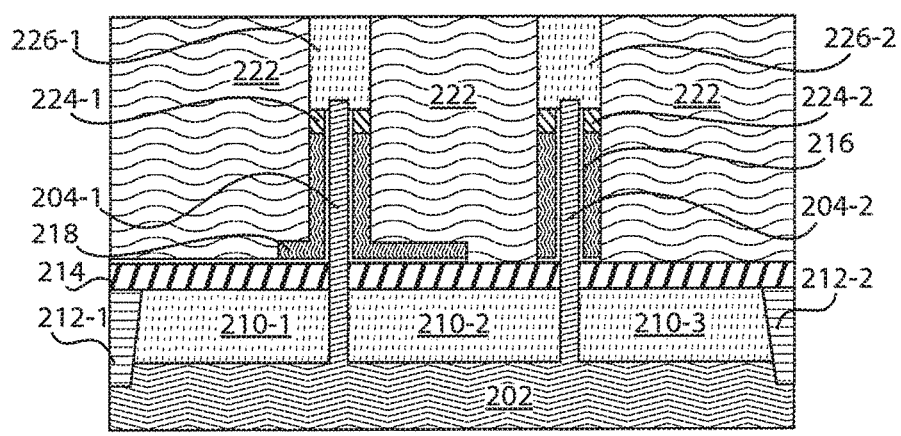
FIG. 11 is a cross-sectional view showing the formation of a top spacer and a top source/drain region during the fabrication of the bottom portion of the semiconductor device, in accordance with an embodiment of the present invention.

Referring to FIG. 11, top spacer 224-1 is formed on the gate stack adjacent to fin 204-1 and top spacer 224-2 is formed on the gate stack adjacent to fin 204-2. The top spacers 224-1 and 224-2 can include any suitable dielectric material in accordance with the embodiments described herein (e.g., SiBCN, SiOCN, SiN or $SiO_2$). As further shown, a top S/D region 226-1 is formed on the top spacer 224-1 and the fin 204-1, and a top S/D region 226-2 is formed on the top spacer 224-2 and the fin 204-2. The top S/D regions 226-1 and 226-2 can be formed using any suitable process in accordance with the embodiments described herein (e.g., epitaxial growth).

Referring to FIG. 12, dielectric layers 228-1 and 228-2 are formed on the ILDs 222 and top S/D regions 226-1 and 226-2. The dielectric layers 228-1 and 228-2 can include any suitable dielectric materials in accordance with the embodiments described herein. Then, S/D contact 230 and gate contact 232 are formed through the dielectric layers 228-1 and 228-2. As shown in this illustrative embodiment, the S/D contact 230 contacts the top S/D region 226-2, and the gate contact 232 contacts the gate conductive material 218 corresponding to fin 204-1. The S/D contact 230 and the gate contact 232 can include any suitable conductive material in accordance with the embodiments described herein. The S/D contact 230 and the gate contact 232 are connected to each other as part of the SRAM cross-couple.

FIGS. 3-12 have described the formation of the bottom tier of the device 200 including a plurality of vertical transistors (e.g., VTFETs). As described above in FIGS. 1 and 2, the plurality of vertical transistors of the bottom tier of the device 200 can be associated with a conductivity type. For example, the plurality of vertical transistors of the bottom tier of the device 200 can include n-type vertical transistors. However, in an alternative embodiment, the plurality of vertical transistors of the bottom tier of the device 200 can include p-type vertical transistors. The arrangement of n-type and p-type transistors can be driven by different wiring considerations.

As will be described in further detail below with reference to FIGS. 13-15, a top tier of the device 200 will be connected to the bottom tier of the device 200 to form the 3D monolithic vertical transistor memory cell with unified inter-tier cross-couple.

Referring to FIG. 13, a dielectric layers 228-3 and 228-4 are formed, and a pristine semiconductor layer 240 is transferred on top of the bottom tier using wafer bonding (e.g., oxide to oxide wafer bonding). In one embodiment, the semiconductor layer 240 includes Si. The semiconductor layer 240 can be capped with a dielectric for bonding. Although not shown, in one embodiment, an SOI wafer can be used to control a thickness of the transferred semiconductor layer 240.

Referring to FIG. 14, processing is performed to create the top tier of the device 200. As shown, the top tier of the device 200 includes fins 242, a bottom S/D regions 244, an STI region 246, a bottom spacer 248, gate dielectric material (e.g., high-k dielectric material) 250, gate stacks including gate conductor material (e.g., work function metal) 252, ILDs 254, top spacers 256, and top S/D regions 258. Referring back to FIG. 2, the gate stacks corresponding to the fins 242-1 and 242-4 can be pass gates, and the gate stack corresponding to the fin 242-2 can be an inverter gate.

Referring back to FIG. 14, the components of the top tier of the device 200 can be formed using similar processes for forming the components of the bottom tier of the device 200, such as those described below with reference to FIGS. 3-12. However, it is noted that temperature constraints during top tier processing can be implemented due to the bottom tier of the device 200.

Referring to FIG. 15, a monolithic inter-level via (MIV) 260 is formed. In this illustrative example, only a single MIV 260 of the cross-couple is shown. However, another MIV (not shown) can be formed to complete the cross-couple, as described above with reference to FIG. 1.

The MIV 260 is similar to the gate contact 232. As shown, the MIV 260 lands on the S/D contact 230 of the bottom tier of the device 200 via the gate stack corresponding to the fin 242-2 and the bottom S/D region 244 adjacent to the STI region 246 of the top tier of the device 200. In this illustrative example, the MIV 260 penetrates through the gate stack corresponding to the fin 242-2 and the bottom S/D region 244 adjacent to the STI region 246 of the top tier of the device 200. However, the MIV 260 can fully penetrate, partially penetrate, abut, and/or partially abut the gate stack corresponding to the fin 242-2 and the bottom S/D region 244 adjacent to the STI region 246 of the top tier of the device 200.

Although the MIV 260 is shown in this embodiment as being recessed to a height within its corresponding ILD 254, the MIV 260 in an alternative embodiment can be filled to the top of its corresponding ILD 254 (as represented by the dotted line in FIG. 15). The MIV 260 can be formed using any suitable processes and materials in accordance with the embodiments described herein.

A dielectric layer 262 can be formed on the ILDs 254 and the top S/D regions 258. The dielectric layer 262 can include any suitable material in accordance with the embodiments described herein.

As further shown, a ground contact 264 can be formed to land on the bottom S/D region 210-1 for ground connection from the top tier of the device 200. The ground contact 264 can include a plurality of vias or lines stacked up. The ground contact 264 can be formed using any suitable processes and materials in accordance with the embodiments described herein. Although not shown, another contact can be formed to the ground contact 264 from the top tier.

The top tier of the device 200 includes a plurality of vertical transistors (e.g., VTFETs). As described above in FIGS. 1 and 2, the plurality of vertical transistors of the top tier of the device 200 can be associated with a conductivity type. For example, the plurality of vertical transistors of the top tier of the device 200 can include p-type vertical transistors. However, in an alternative embodiment, the plurality of vertical transistors of the top tier of the device 200 can include n-type vertical transistors. The arrangement of n-type and p-type transistors can be driven by different wiring considerations.

Figure 16:
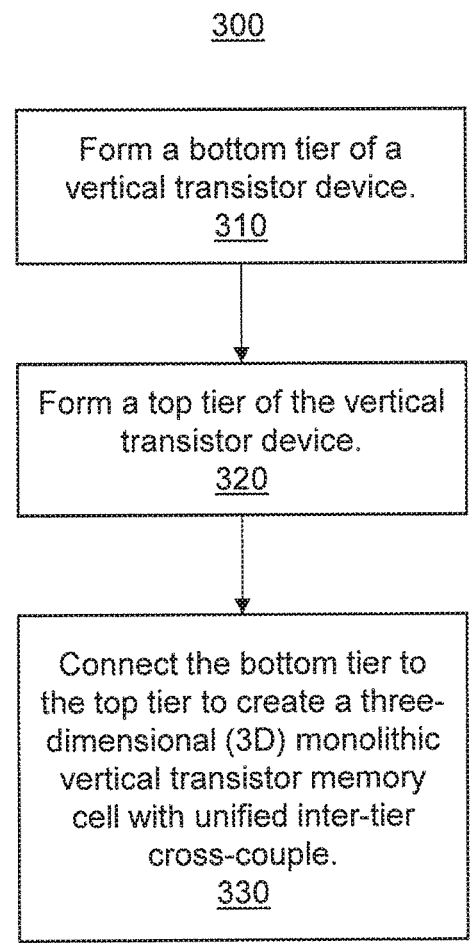
FIG. 16 is block/flow diagram showing a system/method for fabricating a semiconductor device, in accordance with an embodiment of the present invention.

Referring to FIG. 16, a block/flow diagram of a system/method 300 for fabricating a semiconductor device including a 3D monolithic vertical transistor memory cell with unified inter-tier cross-couple is shown.

At block 310, a bottom tier of a vertical transistor device is formed. The bottom tier can include a plurality of first vertical transistors and at least one contact. In one embodiment, the plurality of first vertical transistors includes vertical transport field-effect transistors (VTFETs). The plurality of first vertical transistors can be associated with a first conductivity type. For example, in one embodiment, the first conductivity type is n-type. However, in an alternative embodiment, the first conductivity type is p-type. The at least one contact can include a contact formed on a first inverter gate associated with a given one of the first vertical transistors. For example, the at least one contact can include a gate contact and a source/drain contact, such as the gate contact and the source/drain contact described above with reference to FIG. 12.

At block 320, a top tier of the vertical transistor device is formed. The top tier can include a plurality of second transistors and a second inverter gate associated with a given one of the second vertical transistors. In one embodiment, the plurality of second transistors includes VTFETs. The plurality of second vertical transistors can be associated with a second conductivity type. For example, in one embodiment, the second conductivity type is p-type. However, in an alternative embodiment, the first conductivity type is n-type. In one embodiment, forming the top tier further includes transferring, on the bottom tier, a layer of semiconductor material for forming the top tier using wafer bonding. For example, the wafer bonding can include oxide to oxide wafer bonding.

In one embodiment, the vertical transistor device is a memory cell (e.g., SRAM memory cell) including six vertical transistors (e.g., a 6T memory cell). The vertical transistors can correspond to respective ones of a first ground line (GND), a second ground line (GND), a bit line (BL), an inverse bit line (#BL), a word line (WL) and a supply voltage line (VDD). In this embodiment, the bottom tier can illustratively include two vertical transistors, and the top tier can illustratively include six vertical transistors. However, in an alternative embodiment, the bottom tier can include four vertical transistors, and the top tier can include two vertical transistors.

At block 330, the bottom tier is connected to the top tier to create a 3D monolithic vertical transistor memory cell with unified inter-tier cross-couple. Connecting the bottom tier to the top tier can include forming an MIV that lands on the source/drain contact of the bottom tier via the second inverter gate of the top tier. For example, the MIV can fully penetrate, partially penetrate, abut and/or partially abut the second inverter gate of the top tier. The MIV corresponds to one MIV creating a cross-coupling of inverters of the memory cell. In one embodiment, connecting the bottom tier to the top tier further includes forming a ground contact from the top tier to a bottom source/drain region of the bottom tier.

Further details regarding the formation of the bottom tier, the formation of the top tier and the connection of the bottom tier to the top tier, are described above with reference to FIGS. 1-15.

It is to be understood that the process depicted above with reference to FIGS. 3-15 is purely exemplary, and it is to be appreciated that one or more alternative processes for forming a bottom tier of a vertical transistor device, forming a top tier of the vertical transistor device, and connecting the bottom tier to the top tier to create a 3D monolithic vertical transistor memory cell with unified inter-tier cross-couple can be implemented.

The embodiments described herein can create a memory cell having vertical transistors formed with fins having a height of, e.g., about 20 nm to about 30 nm, a cell height of e.g., about 70 nm to about 80 nm, and a cell width corresponding to a 5.5 contact poly pitch (CPP), where CPP=40 nm. Thus, the memory cell described in FIGS. 1 and 2 can have an area of e.g., about 0.0154 µm to about 0.0176 µm. The illustrative dimensions described herein can be technology node specific.

Having described preferred embodiments of a semiconductor device and a method of fabricating a semiconductor device including a 3D monolithic vertical transistor memory cell with unified inter-tier cross-couple (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device, comprising:
    forming a bottom tier comprising a plurality of first vertical transistors and at least one contact formed on a first inverter gate;
    forming a top tier comprising a plurality of second vertical transistors and a second inverter gate; and
    connecting the bottom tier to the top tier to create a three-dimensional monolithic vertical transistor memory cell with unified inter-tier cross-couple by forming a monolithic inter-tier via (MIV) that lands on the at least one contact via the second inverter gate, and forming a ground contact from the top tier to a bottom source/drain region of the bottom tier.

2. The method of claim 1, wherein at least one of the first and second vertical transistors comprises a vertical transport field-effect transistor (VTFET).

3. The method of claim 1, wherein the plurality of first vertical transistors is associated with a first conductivity type and the plurality of second vertical transistors is associated with a second conductivity type.

4. The method of claim 3, wherein the first conductivity type is n-type and the second conductivity type is p-type.

5. The method of claim 1, wherein the vertical transistor device comprises a six-transistor memory cell.

6. The method of claim 5, Therein the bottom tier comprises two vertical transistors and the top tier comprises four vertical transistors.

7. The method of claim 1, wherein forming the top tier further comprises transferring, on the bottom tier, a layer of semiconductor material for forming the top tier using wafer bonding.

8. The method of claim 7, wherein the wafer bonding comprises oxide-oxide wafer bonding.

9. A method for fabricating a semiconductor device, comprising:
    forming a bottom tier comprising a plurality of first vertical transport field-effect transistors (VTFETs) associated with a first conductivity type and at least one contact formed on a first inverter gate;
    forming a top tier comprising a plurality of second VTFETs associated with a second conductivity type and a second inverter gate; and
    connecting the bottom tier to the top tier to create a three-dimensional monolithic vertical transistor memory cell with unified inter-tier cross-couple by forming a monolithic inter-tier via (MIV) that lands on the at least one contact via the second inverter gate, and forming a ground contact from the top tier to a bottom source/drain region of the bottom tier.

10. The method of claim 9, wherein the first conductivity type is n-type and the second conductivity type is p-type.

11. The method of claim 9, wherein the vertical transistor device comprises a six-transistor memory cell.

12. The method of claim 11, wherein the bottom tier comprises two vertical transistors and the top tier comprises four vertical transistors.

13. The method of claim 9, wherein forming the top tier further comprises transferring, on the bottom tier, a layer of semiconductor material for forming the top tier using wafer bonding.

14. The method of claim 13, wherein the wafer bonding comprises oxide-oxide wafer bonding.

15. A semiconductor device comprising:
    a bottom tier comprising a plurality of first vertical transistors and at least one contact disposed on a first inverter gate;
    a top tier comprising a plurality of second vertical transistors and a second inverter gate;
    a monolithic inter-tier via (MIV) that lands on the at least one contact via the second inverter gate; and
    a ground contact connecting the top tier to a bottom source/drain region of the bottom tier;
    the MIV and the ground contact forming a three-dimensional monolithic vertical transistor memory cell with unified inter-tier cross-couple.

16. The device of claim 15, wherein at least one of the first and second vertical transistor devices comprises a vertical transport field-effect transistor (VTFET).

17. The device of claim 15, wherein the plurality of first vertical transistors is associated with a first conductivity type and the plurality of second vertical transistors is associated with a second conductivity type.

18. The device of claim 17, wherein the first conductivity type is n-type and the second conductivity type is p-type.

* * * * *